(12) United States Patent
Ide et al.

(10) Patent No.: US 7,009,749 B2
(45) Date of Patent: Mar. 7, 2006

(54) OPTICAL ELEMENT AND MANUFACTURING METHOD THEREFOR

(75) Inventors: Daisuke Ide, Gifu (JP); Koji Suzuki, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 188 days.

(21) Appl. No.: 10/367,874

(22) Filed: Feb. 19, 2003

(65) Prior Publication Data

US 2003/0169472 A1 Sep. 11, 2003

(30) Foreign Application Priority Data

Mar. 11, 2002 (JP) ........................ 2002-065578

(51) Int. Cl.
- G02F 1/00 (2006.01)
- G02F 1/03 (2006.01)
- G09G 3/30 (2006.01)
- B32B 9/00 (2006.01)

(52) U.S. Cl. .................. 359/237; 359/245; 359/247; 345/76; 428/690

(58) Field of Classification Search ............... 359/237, 359/245, 247, 248, 254; 345/76; 428/690; 313/506, 504
See application file for complete search history.

(56) References Cited

U.S. PATENT DOCUMENTS

| | | | |
|---|---|---|---|
| 3,662,210 A | 5/1972 | Maximov | 428/656 |
| 5,517,080 A | 5/1996 | Budzilek et al. | 313/509 |
| 5,780,351 A | 7/1998 | Arita et al. | 438/396 |
| 5,945,008 A | 8/1999 | Kisakibaru et al. | 216/71 |
| 6,075,319 A | 6/2000 | Kanda et al. | 313/584 |
| 6,093,934 A | 7/2000 | Yamazaki et al. | 257/51 |
| 6,124,604 A | 9/2000 | Koyama et al. | 257/72 |
| 6,281,552 B1 | 8/2001 | Kawasaki et al. | 257/77 |
| 6,333,528 B1 | 12/2001 | Arita et al. | 257/295 |
| 6,356,029 B1 | 3/2002 | Hunter | 315/169.1 |
| 6,489,046 B1 * | 12/2002 | Ikeda et al. | 428/690 |
| 6,501,466 B1 | 12/2002 | Yamagishi et al. | 345/204 |
| 6,525,704 B1 | 2/2003 | Kondo et al. | 345/78 |
| 6,528,824 B1 | 3/2003 | Yamagata et al. | 257/81 |
| 6,579,787 B1 | 6/2003 | Okura et al. | 438/622 |
| 6,686,693 B1 | 2/2004 | Ogawa | 313/505 |
| 6,717,181 B1 | 4/2004 | Murakami et al. | 257/72 |
| 2002/0190256 A1 | 12/2002 | Murakami et al. | 257/72 |
| 2003/0124042 A1 | 7/2003 | Nakazawa et al. | 423/240 R |
| 2003/0129321 A1 | 7/2003 | Aoki | 427/458 |

FOREIGN PATENT DOCUMENTS

| | | |
|---|---|---|
| CN | 1214799 A | 4/1999 |
| CN | 1223014 A | 7/1999 |

(Continued)

OTHER PUBLICATIONS

L. Brewer et al., "Al–Mo (Aluminum–Molybdenum)", Binary Alloy Phase Diagrams, vol. 1, American Society for Metals, pp. 133–134, Dec. 1990.

Primary Examiner—Georgia Epps
(74) Attorney, Agent, or Firm—McDermott Will & Emery LLP

(57) ABSTRACT

The cathode of an optical element, which is formed by a substrate, an anode formed on the substrate, a luminous element layer and a cathode, is made of aluminum whose surface orientation is substantially uniform. Oxygen content of the aluminum is substantially less or equal to $1 \times 10^{20}$ atoms/cm$^3$.

18 Claims, 5 Drawing Sheets

FOREIGN PATENT DOCUMENTS

| | | |
|---|---|---|
| JP | 61-138259 | 8/1986 |
| JP | 63-250873 | 10/1988 |
| JP | 01-289140 | 11/1989 |
| JP | 02-039536 | 2/1990 |
| JP | 5-249916 | 9/1993 |
| JP | 8-54836 | 2/1996 |
| JP | 8-129358 | 5/1996 |
| JP | 08-306893 | 11/1996 |
| JP | 09-148686 | 6/1997 |
| JP | 09-312292 | 12/1997 |
| JP | 10-170955 | 6/1998 |
| JP | 10-199827 | 7/1998 |
| JP | 10-319872 | 12/1998 |
| JP | 11-111990 | 4/1999 |
| JP | 11-219146 | 8/1999 |
| JP | 11-260562 | 9/1999 |
| JP | 2000-221903 A | 8/2000 |
| JP | 2000-236097 A | 8/2000 |
| JP | 2000-277607 A | 10/2000 |
| JP | 2000-347621 A | 12/2000 |
| JP | 2000-347621 | 12/2000 |
| JP | 2000-349298 A | 12/2000 |
| JP | 2001-56667 | 2/2001 |
| JP | 2001-58887 | 2/2001 |
| JP | 2001-60076 A | 3/2001 |
| JP | 2001-060076 | 3/2001 |
| JP | 2001-282136 A | 10/2001 |
| JP | 2001-308094 A | 11/2001 |
| JP | 2001-350159 | 12/2001 |
| JP | 2001-350448 | 12/2001 |
| JP | 2002-040963 A | 2/2002 |
| JP | 2003-195811 | 7/2003 |
| WO | WO 97/36324 | 10/1997 |
| WO | WO 98/36407 | 8/1998 |
| WO | WO 98/45881 | 10/1998 |
| WO | WO 01/06484 A1 | 1/2001 |
| WO | WO 01/75852 A1 | 10/2001 |

* cited by examiner

OPTICAL ELEMENT AND MANUFACTURING METHOD THEREFOR

BACKGROUND OF THE INVENTION

1. Field of the Invention

The present invention relates to optical elements and a method of manufacturing the optical elements.

2. Description of the Related Art

Recently, organic electroluminescent (EL) display apparatus employing organic light emitting diodes (hereinafter referred to as OLED) as luminous elements are attracting much attention as display apparatus to replace CRTs and LCDs.

Holes and electrons are injected to a luminescent layer from an anode formed on a glass substrate and a cathode provided above the anode, respectively. Then, these holes and electrons recombine with each other so as to produce excitons. And in the process of radiation deactivation of the excitons, light emanates from the luminescent layer and the organic EL element thus emits the light. It is to be noted here that a hole transport layer is provided between the anode and the luminescent layer whereas an electron transport layer is provided between the cathode and the luminescent layer.

As a problem, the electron transport layer and luminescent layer in the organic EL elements structured as above are liable to be affected by impurities such as water molecules and oxygen molecules, and the deterioration thereof with time is generally conspicuous compared to LCDs or the like.

Moreover, it is difficult to stably inject electrons into the luminescent layer, so that there is a problem where variation in luminance is caused. In order to inject the electrons stably, metal with a low work function is used as cathode material. Moreover, the cathode requires such measures as lowering resistance, reducing whiskers and hillocks or eliminating electromigration or stressmigration.

SUMMARY OF THE INVENTION

The present invention has been made in view of the foregoing circumstances and an object thereof is to provide a technique by which to suppress the luminance variation of an optical element. Another object of the present invention is to suppress or eliminate the deterioration variation of the optical element per hour. Still another object of the present invention is to extend the optical element life. Still another object of the present invention is to improve injection efficiency of electrons in the optical element.

According to the present invention, a cathode is made of aluminum which has low resistivity, so that the resistance of the cathode can be lowered. However, aluminum has a problem that the work function thereof may vary with the surface orientation thereof. For example, the work function of aluminum is 4.06 eV for surface orientation (110), 4.24 eV for surface orientation (111) and 4.41 eV for surface orientation (100). The unevenness of work function in the cathode causes the probability of injection of electrons from a position with lower work function, and thus a marked degradation is caused at the position. Moreover, variation in work function in the cathode as a whole presents a problem of correspondingly varied electron injection efficiency, which causes uneven brightness by affecting the luminance of the optical element.

In consideration of the above problems, the inventor had recognized that a uniformity of work function in a cathode as a whole can be achieved by implementing a structure in which the cathode is formed by aluminum having substantially uniform surface orientation. According to the present invention, there is provided an optical element which includes at least a substrate; an anode formed on the substrate; a luminous element layer formed on the anode; and a cathode formed on the luminous element layer, wherein the cathode is structured by aluminum having substantially uniform surface orientation. Here, "substantially uniform" means that, as determined by an X-ray analyzing method, the aluminum has at least 90% or more of the same surface orientation.

Structuring a cathode with aluminum having substantially uniform surface orientation can achieve a uniformity of work function in the cathode as a whole, thus preventing partial degradation of the element. Thereby, the variation in luminance can also be reduced. The luminous element layer may be an organic EL element. Moreover, the cathode here may be structured of aluminum having substantially uniform surface orientation at the interface on a luminous element layer side.

The surface orientation of the aluminum may be (110) or (111). The work function of the cathode can be lowered by setting the surface orientation of the aluminum to (110) or (111), so that the electron injection efficiency can be enhanced.

This optical element may further include a lithium fluoride layer, in contact with the cathode, provided between the luminous element layer and the cathode. Film thickness of the lithium fluoride layer may be in the range of substantially 0.5 nm to 2 nm both inclusive.

The energy barrier at the interface between the luminous element layer and the cathode may be lowered by providing the lithium fluoride layer between the luminous element layer and the cathode. This will improve the electron injection efficiency, thereby also improving the lifetime of the element. It should be noted here that a similar effect can be produced by substituting the above-mentioned lithium fluoride layer by a layer made of a metal oxide such as $Li_2O$, MgO or $Al_2O_3$, or a metal halogenide such as $MgF_2$ or $SrF_2$.

According to the present invention, there is provided an optical element which includes at least: a substrate; a first electrode formed on the substrate; a luminous element layer formed on the first electrode; and a second electrode formed on the luminous element, wherein oxygen content in the aluminum of the second electrode is substantially $1\times10^{20}$ atoms/cm$^3$ or below at least in the vicinity of interface with the luminous element layer. The "vicinity of interface" means place between the interface and the center of the second electrode. Reduction of the oxygen content in the second electrode particularly in the vicinity of the interface with the luminous element layer can reduce the impurities on an electron transport layer and a luminescent layer, so that deterioration of the organic EL can be prevented. Here, the first electrode may be an anode whereas the second electrode may be a cathode.

Moreover, where a lithium fluoride layer is provided between the luminous element layer and the second electrode, the lithium fluoride layer, which is an insulating film, assumes electric polarities, so that if impurities are contained in the second electrode, oxides such as alumina or other impurities tend to segregate at the interface with the second electrode. Impurities partially segregating near the interface serve as a resistance component to the injection of electrons, thereby accelerating the degradation of the element. However, lowering the oxygen content in the second electrode can reduce the segregation of these impurities and prevent the degradation of the organic EL element.

Furthermore, the second electrode may be made of high purity aluminum. Thus, oxides within the aluminum are reduced, and segregation of impurities near the interface can be suppressed or eliminated. Moreover, the surface orientation of the aluminum can be made uniform.

According to the present invention, there is provided a method of manufacturing an optical element, the method including forming a second electrode by vapor depositing aluminum under a low-pressure atmosphere of substantially $1\times10^{-4}$ Pa or below, over a substrate on which at least a first electrode and a luminous element layer are formed. Forming thus the second electrode under high vacuum state reduces the oxygen concentration in the second electrode, so that oxides can be reduced. Thus, the segregation of impurities toward near the interface with the luminous element layer can be suppressed or eliminated. As a result thereof, the surface orientation of aluminum in the second electrode can also be made substantially uniform.

The vapor deposition may be carried out at 40° C. or below. The vapor deposition temperature can be 0° C. or above, or preferably 20° C. or above. By forming the second electrode within a room temperature range from 20° C. to 40° C., both inclusive, the diffusion of aluminum atoms can be reduced and an aluminum layer whose surface orientation for a stable energy state is (111) can be structured. Moreover, the temperature control like this can suppress the diffusion of impurities adhering to the substrate, such as oxygen or carbon, and can suppress these impurities from diffusing to and depositing at the interface between the luminous element layer and the second electrode or elsewhere.

This method may further include forming a lithium fluoride layer over the luminous element layer, under the low-pressure atmosphere, and the second electrode may be formed on the lithium fluoride layer without the substrate being taking out of the low-pressure atmosphere. In this manner, the oxidation of the interface of these layers can be prevented by continuously forming both the lithium fluoride layer and the second electrode under the low-pressure atmosphere. Moreover, the contamination by impurities can be prevented, and the deposition of the impurities into the interface can be suppressed. Moreover, the second electrode with substantially uniform surface orientation can be formed on the lithium fluoride layer.

Moreover, the second electrode may be provided commonly to a plurality of luminous element layers. The current density can be lowered and the electromigration can be prevented by forming the second electrode on all over the plurality of luminous element layers.

It is to be noted that any arbitrary combination of the above-described structural components, and expressions changed between a method and an apparatus are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
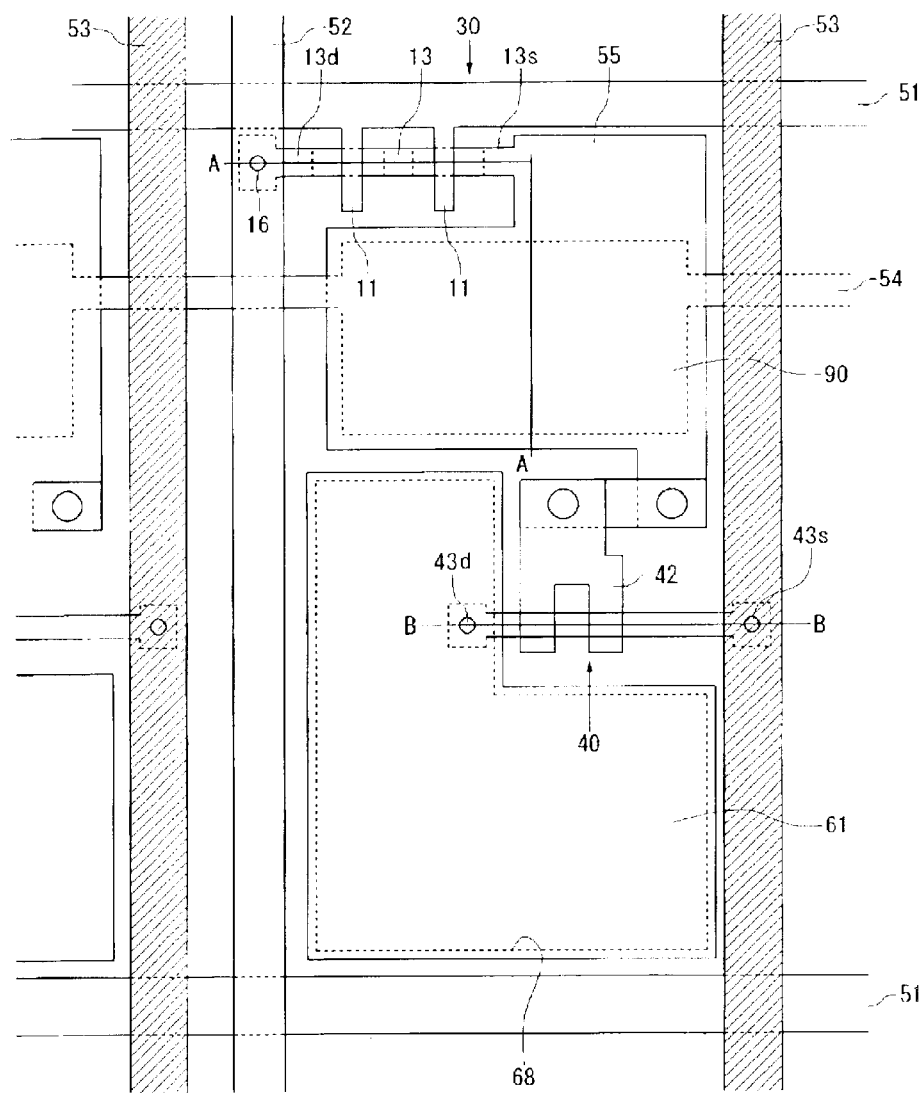
FIG. 1 shows a plan view of a display pixel of an organic EL display apparatus.
Figure 2A:
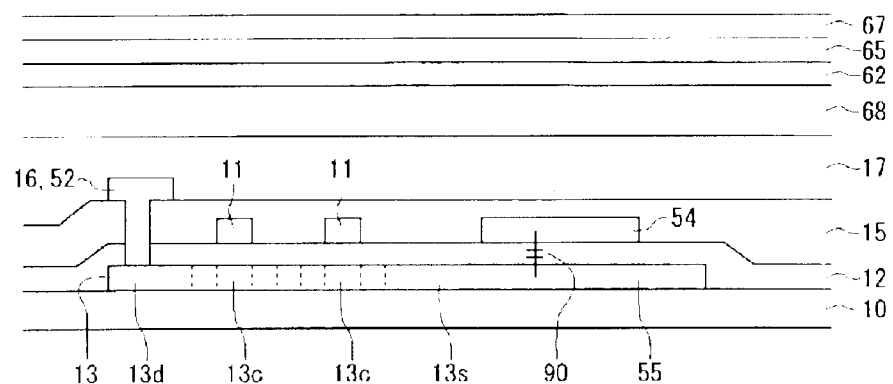
FIG. 2A shows a cross-sectional view along line A—A in FIG. 1.
Figure 2B:
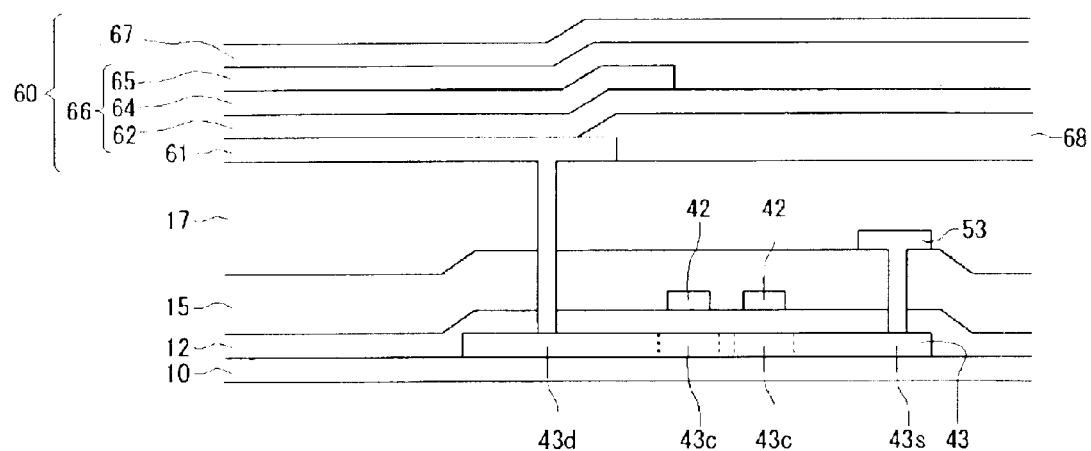
FIG. 2B shows a cross-sectional view along line B—B in FIG. 1.

An optical element according to the present embodiments is an organic EL element used for an organic EL display apparatus. First, the general structure of display pixels of the organic EL display apparatus is described based on FIG. 1 and FIGS. 2A and 2B. FIG. 1 shows a plan view of a display pixel of an organic EL display apparatus. FIG. 2A shows a cross-sectional view along line A—A in FIG. 1, and FIG. 2B shows a cross-sectional view along line B—B in FIG. 1.

A pixel is formed in a region surrounded by a gate signal line 51 and a drain signal line 52. The pixel has a first TFT 30 as a switching element, a second TFT 40 for driving an organic EL element, and a capacitor 90.

The first TFT 30 comprises a gate electrode 11 connected to the gate signal line 51 and to which a gate signal is sent, a drain electrode 13d connected to the drain signal line 52 and to which a drain signal is sent, and a source electrode 13s connected to the second TFT 40 via one of electrodes 55 in the capacitor 90.

One of the electrodes 55 in the capacitor 90 is integrally molded with the source electrode 13s in the first TFT. The other of the electrodes 54 in the capacitor 90 is made of, for example, chromium, and stores a charge between it and the electrode 55 via a gate insulating film. The capacitor 90 retains a voltage applied to the gate electrode 42 in the second TFT 40.

The second TFT 40 comprises a gate electrode 42 connected to the source electrode 13s in the first TFT 30, a drain electrode 43d connected to an anode 61 in an organic EL element 60, and a source electrode 43s connected to a driving power line 53.

FIG. 2A shows a cross section on line A—A in FIG. 1 while FIG. 2B shows a cross section on line B—B in FIG. 1. As illustrated in FIG. 2A, an active layer 13 is formed on an insulating substrate 10. The insulating substrate 10 may be made of, for example, quartz glass or non-alkali glass. The active layer 13 may be made of a polycrystalline silicon (p-Si) film formed by polycrystallizing by irradiation of amorphous silicon (a-Si) film with laser beam. In this figure, a top gate structure is illustrated, but the present invention is not limited to the specific structure. The active layer 13 comprises a source electrode 13s and a drain electrode 13d on both sides of two channels 13c. In this embodiment, the source electrode 13s and the drain electrode 13d are ion-doped with an n-type dopant, and the first TFT 30 is of an n-channel type.

Over the active layer 13 is formed a gate insulating film 12, over which is then formed the gate electrode 11, and one of the electrodes 54 in the capacitor 90. The gate electrode 11 may be made of a refractory metal such as chromium and molybdenum, and constitutes a part of the gate signal line 51 illustrated in FIG. 1.

Over the whole surface of the gate electrode 11 and the gate insulating film 12 is formed an interlayer insulating film 15 consisting of a SiN film and an $SiO_2$ film. A contact hole formed in relation to the drain electrode 13d is filled with a metal such as aluminum to form a drain extraction electrode 16 constituting a part of the drain signal line 52.

As illustrated in FIG. 2B, an active layer 43 is formed on the insulating substrate 10. The active layer 43 may be made of the same material as the active layer 13. In the active layer 43 is formed the channel 43c, on both side of which are formed a source electrode 43s and the drain electrode 43d. In this embodiment, the source electrode 43s and the drain electrode 43d are ion-doped with a p-type dopant and the second TFT 40 is of a p-channel type.

Over the active layer 43 is formed the gate insulating film 12, over which is then formed the gate electrode 42. The gate electrode 42 is made of a refractory metal such as chromium and molybdenum. The gate electrode 42 is connected to the source electrode 13s in the first TFT 30. In the active layer 43, the channel 43c is formed under the gate electrode 42.

Over the whole surface of the gate insulating film 12 and the gate electrode 42 is formed the interlayer insulating film 15. A contact hole formed in relation to the source electrode 43s is filled with a metal such as aluminum to form the driving power line 53.

Over the whole surface of the interlayer insulating film 15, the drain extraction electrode 16 (shown in FIG. 2A) and the driving power line 53 is formed a planarized insulating film 17 made of, for example, an organic resin. On the planarized insulating film 17 is formed the organic EL element 60. The organic EL element 60 has a structure where an anode 61, a light emitting element layer 66 and a cathode 67 are deposited in sequence. The anode 61 is connected to the drain electrode 43d via a contact hole formed in relation to the drain electrode 43d in the planarized insulating film 17. On the anode 61 is formed an insulating film 68. The insulating film 68 is formed for preventing short-circuit between the cathode 67 and the anode 61 caused by a break in a light emitting element layer 66 due to a step generated from a thickness of the anode 61.

Examples of a material for the anode 61 include Indium-Tin-Oxide (ITO), tin oxide ($SnO_2$) and indium oxide ($In_2O_3$). Generally, ITO is used because of its hole-injection effectiveness and a low surface resistance. Examples of a material for the cathode 67 include an aluminum alloy containing a trace amount of lithium, a magnesium-indium alloy, and a magnesium-silver alloy. The light emitting element layer 66 has a structure where a hole transport layer 62, a light-emitting layer 64 and an electron transport layer 65 are deposited in sequence. Examples of a material for the hole transport layer 62 include 4,4',4''-tris(3-methylphenylphenylamino)triphenylamine (MTDATA), N,N'-Di(naphthalene-1-yl)-N,N'-diphenyl-benzidine(NPB) and N,N'-diphenyl-N,N'-di(3-methylphenyl)-1,1'-biphenyl-4,4'-diamine(TPD). Examples of a material for the light-emitting layer 64 include a bis(benzoquinolinato) beryllium complex comprising a quinacridone derivative (bis (10-hydroxybenzo[h]quinolinolato) beryllium:Bebq2) and an aluminum-quinolene complex (Alq3). Examples of a material for the electron transport layer 65 include Bebq2 and Alq3. The structure of the cathode 67 will be described in the following.

The hole transport layer 62, the electron transport layer 65 and the cathode 67 are formed such that they are shared by a plurality of the organic EL elements 60 in each pixel. The light-emitting layer 64 is formed as an island in response to the anode 61.

The above configurations and materials for a pixel are only illustrative and do not limit the scope of the present invention. For example, the first TFT 30 and the second TFT 40 may be of an n-channel type, a p-channel type or even a combination of an n-channel and a p-channel types. In the first TFT 30, the part consisting of the drain electrode 13d and the source electrode 13s may be replaced with a source electrode and a drain electrode in response to a voltage applied, respectively. The organic EL element 60 may have a structure where the anode 61, the light emitting element layer 66 and the cathode 67 are deposited in reverse. An intervening layer may be formed between layers.

There will be described operation for light-emitting of the organic EL element in a pixel thus configured. On applying a gate signal from the gate signal line 51 to the gate electrode 11, the first TFT 30 is turned on. Thus, the charge applied from the source electrode 13s in the first TFT 30 is stored in the capacitor 90 while being applied to the gate electrode 42 in the second TFT 40. To the organic EL element 60, a current in response to the voltage applied to the gate electrode 42 in the second TFT 40 is fed from the driving power line 53.

In the organic EL element 60, holes injected from the anode 61 and electrons injected from the cathode 67 are recombined inside of the light-emitting layer 64 to excite the organic molecules constituting the light-emitting layer 64 for generating excitons. In the course of energy-emitting inactivation of the excitons, the light-emitting layer 64 emits a light, which is discharged via the transparent anode 61 and is perceived as light-emission of the organic EL element 60.

The features of the present invention will be described below, based on the structure of the display pixel of the organic EL display apparatus described above. According to an embodiment of the present invention, the cathode 67 is made of aluminum. The resistance of the cathode can be lowered by forming the cathode with an aluminum which has a low resistivity.

Moreover, a lithium fluoride layer is provided between the electron transport layer 65 and the cathode 67. This arrangement raises the injection efficiency of electrons injected from the cathode 67 into the electron transport layer 65, thereby extending the lifetime of the element.

It is to be noted here that aluminum to form the cathode 67 is selected from ones with high purity. The purity of aluminum is preferably 99.9% or above. Moreover, the lithium fluoride layer and the cathode 67 are formed by vapor deposition under reduced pressure of $1\times10^{-4}$ Pa or below. Through this process, impurities in the lithium fluoride layer and the cathode 67 are reduced. As a result, impurities do not segregate at these interfaces and thus the degradation of the element can be prevented. Moreover, the effects of impurities on the electron transport layer 65, the luminescent layer 63 and so forth can be eliminated, thus further contributing to the prevention of the element degradation. The pressure reduction at the vapor deposition of the lithium fluoride layer and the cathode 67 is carried out using a cryopump. Impurities such as carbon can be reduced by the use of the cryopump.

In particular, the cathode 67 is formed by performing a vapor deposition of aluminum under reduced pressure within a normal temperature range between 20° C. to 40° C. both inclusive. Vapor deposition at normal temperatures like this allows the surface orientation of the aluminum to become (111), which is stable. Moreover, as described above, the vapor deposition under reduced pressure prevents a disarray of surface orientation due to the presence of impurities, so that the cathode 67 can be formed with an aluminum having a substantially uniform surface orientation. The vapor deposition at normal temperatures suppresses the diffusion of impurities adhering to the substrate, thus producing the effect of suppressing the diffusion of these impurities to the interface between the luminescent layer 66 and the cathode 67.

After the formation of the cathode 67, the cathode 67 is subjected to a heating treatment at 50° C. to 100° C. both inclusive. This process further removes impurities such as water content, thus stabilizing the organic EL element 60.

It should be noted here that, as have been described, the cathode 67 is formed for all the luminous element layers 66 of each display pixel, so that the current density drops so as to prevent electromigration.

EXAMPLE

An example of method of forming of the cathode 67 will be described hereinbelow.

A substrate with an electron transport layer 65 formed thereon was introduced into a chamber, where the ambience was brought into a reduced pressure of $5 \times 10^{-5}$ Pa by a load-lock type cryopump. In this low pressure ambience, lithium fluoride was vapor-deposited in a 1 nm-thick film on the electron transport layer 65. While maintaining this reduced pressure condition, aluminum was vapor-deposited into a 400 nm thickness on the lithium fluoride film at 30° C. The aluminum used was of high purity (99.9% or above).

Thereafter, the substrate was heat-treated at 80° C. for 60 minutes without being exposed to atmospheric air. This step is a preprocessing for the sealing, with metal or glass, of a cathode side of the entire organic EL display together with desiccant after the formation of the cathode.

The thickness of the lithium fluoride film can be achieved in the rage of 0.5 nm to 2 nm, both inclusive. This range is determined because a uniform film may be formed over the entire surface of the substrate when the film thickness is about 0.5 nm or above and the direct-tunneling current begins to decrease abruptly when it is about 2 nm. Introduction of the lithium fluoride film can reduce a voltage to be applied to the organic EL element, thus being capable of slowing the deterioration of the hole transport layer and the like and extending the lifetime of the element.

Figures 3A, 3B:
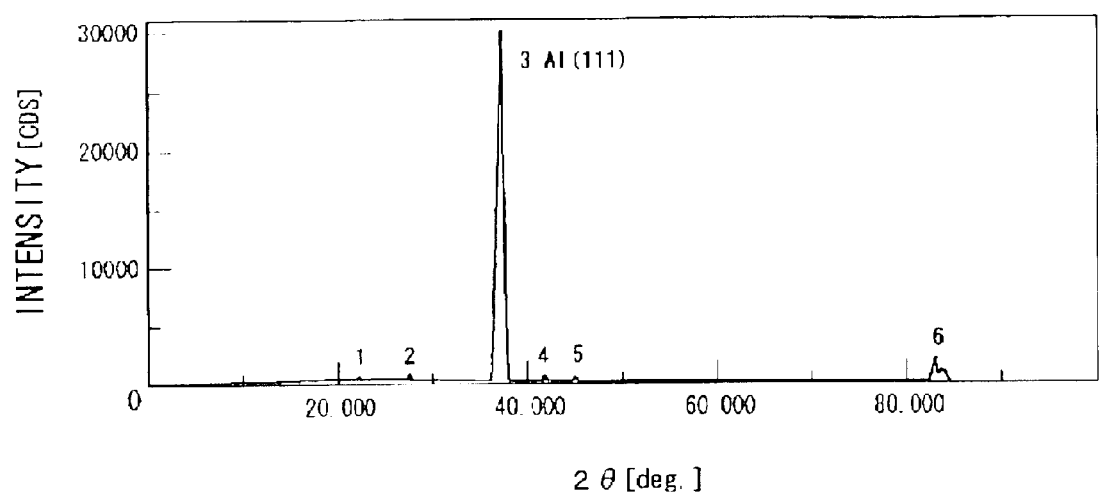
FIGS. 3A and 3B show analysis results by an X-ray diffraction method of an aluminum layer formed according to an example of the present invention.

FIGS. 3A and 3B show analysis results by an X-ray diffraction method of an aluminum layer formed as described above. As is evident from FIGS. 3A and 3B, peak 3 appears at the position of 2θ=38.44, which represents the surface orientation (111). In the comparison of intensity with the other peaks, it is clear that more than 92% (29946/32496) represent the surface orientation (111). It is to be noted that peak 6 at the position of 2θ=82.40 in FIGS. 3A and 3B signifies aluminum of surface orientation (222) which occurs incidentally where aluminum of surface orientation (111) is present. Hence, the comparison of ratio in intensity of peaks 3 and 6 with the other peaks suggests that more than 95% (31098/32496) represent the surface orientation (111). Furthermore, the other peaks 1, 2, 4 and 5, which are extremely small, are believed to represent impurities rather than aluminums of other surface orientations. From these results, it is considered that nearly 100% represents the surface orientation (111).

Figure 4:
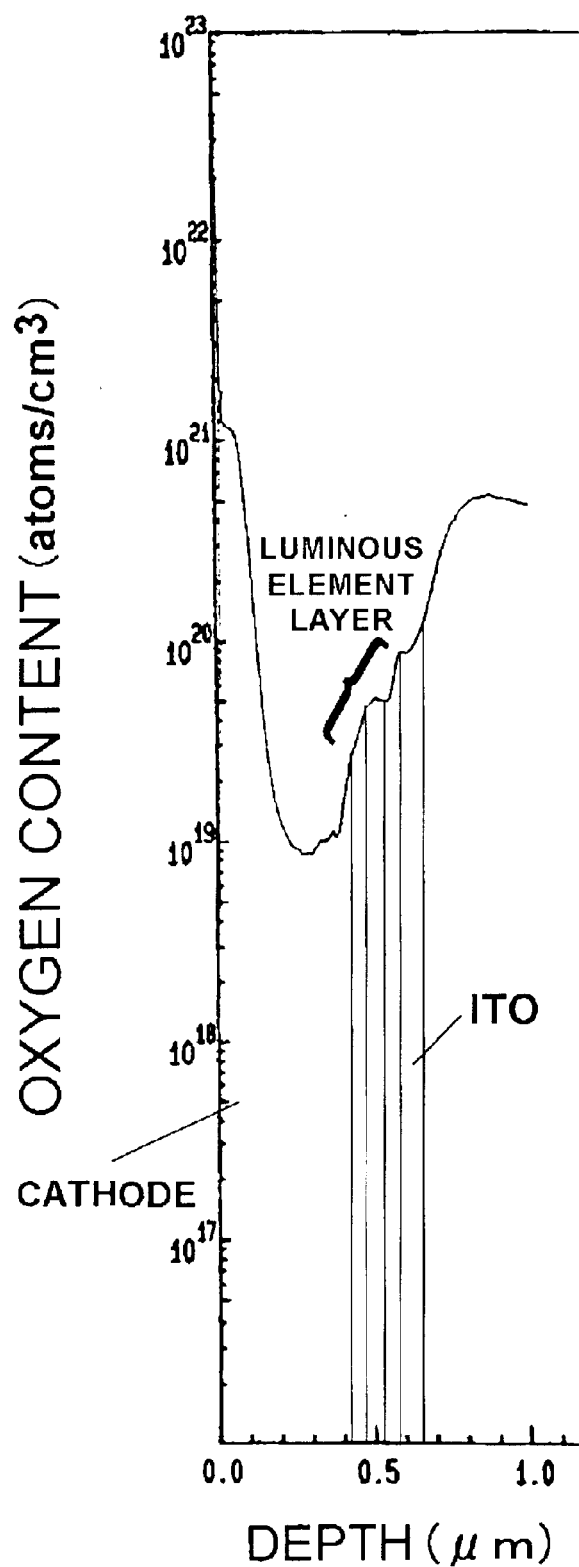
FIG. 4 shows measurement results of oxygen content in an optical element formed according to an example of the present invention.

FIG. 4 shows measurement results of oxygen content in the optical element formed as described above. The concentration of oxygen was measured by SIMS (secondary-ion mass spectrometry). Referring to FIG. 4, the oxygen content in the aluminum layer was, for the most part, $1 \times 10^{20}$ atoms/cm$^3$ or less. The oxygen content is $1 \times 10^{21}$ atoms/cm$^3$ near the surface which comes under the influence of the atmosphere during the measurement, but is $1 \times 10^{20}$ atoms/cm$^3$ at the depth of about 0.1 μm and approximately $1 \times 10^{19}$ atoms/cm$^3$ at depths of 0.25 μm or more near the interface with the luminescent layer.

Figure 5:
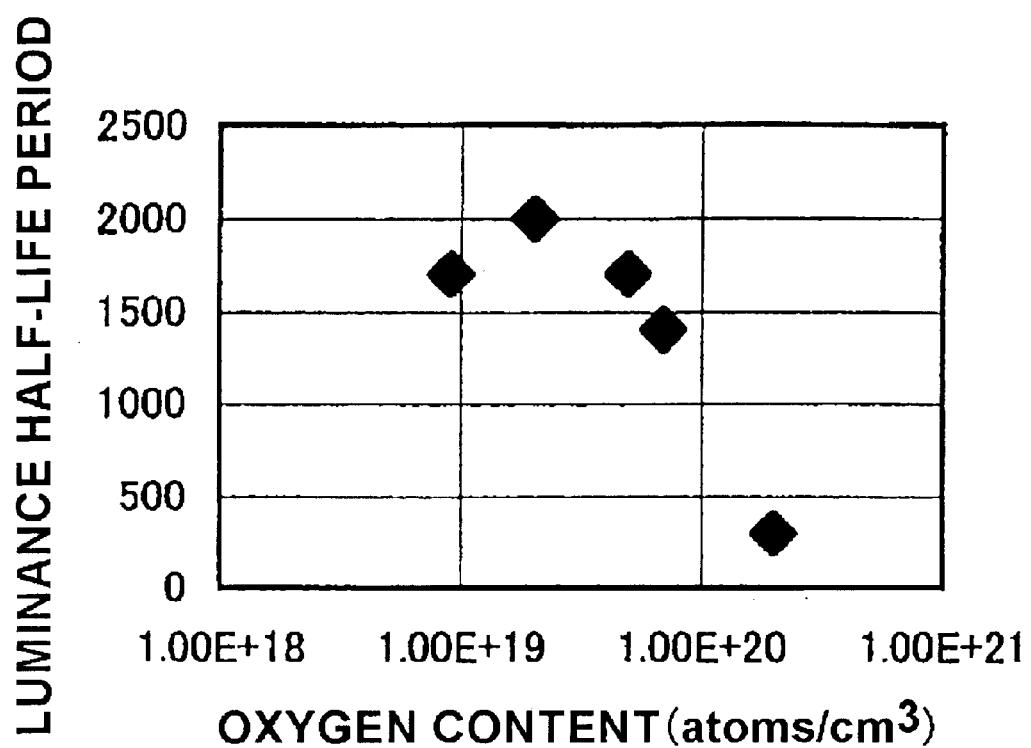
FIG. 5 is a graph showing relationship between the oxygen content in a cathode and the luminance half-life period.

FIG. 5 is a graph showing relationship between the oxygen content in the cathode and the luminance half-life period of green (G). As is clear from FIG. 5, the luminance half-life period becomes markedly shorter for the oxygen content in the cathode of $1 \times 10^{20}$ atoms/cm$^3$ or higher.

As have been described and demonstrated, according to the example of the present invention, a cathode is formed with aluminum having the substantially uniform surface orientation. Moreover, the oxygen content in the cathode was $1 \times 10^{20}$ atoms/cm$^3$ or below at least near the interface with the luminous element layer. From these results, it is apparent that the cathode formed according to the preferred example of the present invention can extend the lifetime of an organic EL element and reduce the variation in the luminance thereof.

Although the present invention has been described by way of exemplary embodiments, it should be understood that many changes and substitutions may further be made by those skilled in the art without departing from the scope of the present invention which is defined by the appended claims.

What is claimed is:

1. An optical element, including at least:
   a substrate;
   a first electrode formed on said substrate;
   a luminous element layer formed on said first electrode; and
   a second electrode formed on said luminous element,
   wherein said second electrode is made of aluminum having substantially uniform surface orientation of (111).

2. An optical element according to claim 1, wherein said second electrode is made of aluminum having at least 90% or more of a same surface orientation, as determined by an X-ray analyzing method.

3. An optical element according to claim 1, wherein oxygen content in the aluminum of said second electrode is substantially $1 \times 10^{20}$ atoms/cm$^3$ or below at least in the vicinity of interface between said second electrode and said luminous element layer.

4. An optical element according to claim 1, further including a lithium fluoride layer, in contact with said second electrode, provided between said luminous element layer and said second electrode.

5. An optical element according to claim 4, wherein film thickness of said lithium fluoride layer is in the range of substantially 0.5 nm to 2 nm.

6. An optical element, including at least:
   a substrate;
   a first electrode formed on said substrate;
   a luminous element layer formed on said first electrode; and
   a second electrode formed on said luminous element,
   wherein oxygen content in said second electrode is substantially $1 \times 10^{20}$ atoms/cm$^3$ or below at least in the vicinity of interface between said second electrode and said luminous element layer.

7. An optical element according to claim 6, wherein the surface orientation is (111).

8. An optical element according to claim 6, wherein said second electrode is made of aluminum having at least 90% or more of a same surface orientation, as determined by an X-ray analyzing method.

9. An optical element according to claim 6, further including a lithium fluoride layer, in contact with said second electrode, provided between said luminous element layer and said second electrode.

10. An optical element according to claim 9, film thickness of said lithium fluoride layer is in the range of substantially 0.5 nm to 2 nm.

11. A method of manufacturing an optical element, the method including forming a second electrode by vapor depositing aluminum under a low-pressure atmosphere of substantially $1 \times 10^{-4}$ Pa or below, over a substrate on which at least a first electrode and a luminous element layer are formed, wherein the vapor depositing is performed within a temperature range between substantially 20° C. to 40° C. both inclusive.

12. A method of manufacturing an optical element according to claim 11, further including forming a lithium fluoride layer over said luminous element layer, under the low-pressure atmosphere, wherein said second electrode is formed on said lithium fluoride layer without said substrate being taking out of the low-pressure atmosphere.

13. A method of manufacturing an optical element, the method including:

forming a second electrode by vapor depositing aluminum under a low-pressure atmosphere of substantially $1 \times 10^{-4}$ Pa or below, over a substrate on which at least a first electrode and a luminous element layer are formed; and forming a lithium fluoride layer over said luminous element layer, under the low-pressure atmosphere, wherein said second electrode is formed on said lithium fluoride layer without said substrate taking out of the low-pressure atmosphere, and wherein said lithium fluoride is formed in such a mariner that film thickness thereof is within a range of substantially 0.5 nm to 2 nm in said forming said lithium fluoride layer.

14. A method of manufacturing an optical element, the method including forming a second electrode by vapor depositing aluminum under a low-pressure atmosphere of substantially $1 \times 10^{-4}$ Pa or below, over a substrate on which at least a first electrode and a luminous element layer are formed, to have said second electrode made of aluminum having substantially uniform surface orientation of (111).

15. A method of manufacturing an optical element according to claim 14, further including forming a lithium fluoride layer over said luminous element layer, under the low-pressure atmosphere, wherein said second electrode is formed on said lithium fluoride layer without said substrate being taking out of the low-pressure atmosphere.

16. A method of manufacturing an optical element, the method including forming a second electrode by vapor depositing aluminum under a low-pressure atmosphere of substantially $1 \times 10^{-4}$ Pa or below, over a substrate on which at least a first electrode and a luminous element layer are formed, to have oxygen content in said second electrode substantially $1 \times 10^{20}$ atoms/cm$^3$ or below at least in the vicinity of interface between said second electrode and said luminous element layer.

17. A method of manufacturing an optical element according to claim 16, further including forming a lithium fluoride layer over said luminous element layer, under the low-pressure atmosphere, wherein said second electrode is formed on said lithium fluoride layer without said substrate being taking out of the low-pressure atmosphere.

18. An optical element, including at least:

a substrate;

a first electrode formed on said substrate;

a luminous element layer formed on said first electrode; and a second electrode formed on said luminous element, wherein said second electrode is made of aluminum having at least 90% or more of a same surface orientation, as determined by an X-ray analyzing method.

* * * * *